United States Patent
Ho et al.

(10) Patent No.: US 8,525,022 B2
(45) Date of Patent: Sep. 3, 2013

(54) HIGH EFFICIENCY MULTI-LAYER PHOTOVOLTAIC DEVICES

(75) Inventors: John Ho, Cambridge, MA (US); Vladimir Bulovic, Lexington, MA (US); Tim Osedach, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 327 days.

(21) Appl. No.: 12/735,382

(22) PCT Filed: Jan. 9, 2009

(86) PCT No.: PCT/US2009/030626
§ 371 (c)(1),
(2), (4) Date: Oct. 19, 2010

(87) PCT Pub. No.: WO2009/089470
PCT Pub. Date: Jul. 16, 2009

(65) Prior Publication Data
US 2011/0036971 A1    Feb. 17, 2011

Related U.S. Application Data

(60) Provisional application No. 61/020,595, filed on Jan. 11, 2008.

(51) Int. Cl.
*H01L 31/00* (2006.01)
(52) U.S. Cl.
USPC ............................ 136/263; 136/255; 136/256
(58) Field of Classification Search
USPC ......... 250/214.1; 136/255, 263, 256; 257/40
See application file for complete search history.

(56) References Cited

U.S. PATENT DOCUMENTS

| | | | |
|---|---|---|---|
| 5,512,131 A | 4/1996 | Kumar et al. | |
| 5,821,019 A | 10/1998 | Nguyen | |
| 5,930,565 A * | 7/1999 | Doi et al. | 399/159 |
| 6,180,239 B1 | 1/2001 | Whitesides et al. | |
| 6,251,303 B1 | 6/2001 | Bawendi et al. | |
| 6,322,901 B1 | 11/2001 | Bawendi et al. | |
| 6,518,168 B1 | 2/2003 | Clem et al. | |
| 6,576,291 B2 | 6/2003 | Bawendi et al. | |
| 7,208,122 B2 | 4/2007 | Swager et al. | |
| 7,322,211 B2 | 1/2008 | McKenzie | |
| 2004/0023010 A1 | 2/2004 | Bulovic et al. | |
| 2006/0157720 A1 | 7/2006 | Bawendi et al. | |
| 2006/0196375 A1 | 9/2006 | Coe-Sullivan et al. | |
| 2007/0235753 A1* | 10/2007 | Debucquoy et al. | 257/113 |
| 2008/0001167 A1 | 1/2008 | Coe-Sullivan et al. | |

FOREIGN PATENT DOCUMENTS

| | | |
|---|---|---|
| JP | 2003-234485 | 8/2003 |
| JP | 2007-258263 | 10/2007 |

OTHER PUBLICATIONS

Adachi et al., Appl. Phys. Lett. 78, 1622 (2001).
Bulovic et al., Semiconductors and Semimetals 64, 255 (2000).
Bulovic, V. et al., *Nature* 1996, 380, 29.
D'Andrade et al., MRS Fall Meeting, BB6.2 (2001).
Din et al., Jpn. J. Appl. Phys. 37, 1457 (1998).
Gu, G. et al., *Appl. Phys. Lett.* 1996, 68, 2606-2608.
Sista, S. et al., Appl. Phys. Lett. 91, 223508 (2007).
Yamasaki et al., Appl. Phys. Lett. 76, 1243 (2000).

* cited by examiner

*Primary Examiner* — Thanh Luu
(74) *Attorney, Agent, or Firm* — Steptoe & Johnson LLP

(57) ABSTRACT

A photovoltaic device includes a heterojunction between different semiconductor materials which are present in charge transporting layers. The device can include laterally-arranged electrodes.

19 Claims, 6 Drawing Sheets

Before Analyte

After Analyte

HIGH EFFICIENCY MULTI-LAYER PHOTOVOLTAIC DEVICES

CLAIM OF PRIORITY

This application claims priority under 35 USC 371 to International Application No. PCT/US2009/030626, filed on Jan. 9, 2009, which claims priority to U.S. Provisional Application Ser. No. 61/020,595, filed Jan. 11, 2008, each of which is incorporated by reference in its entirety.

FEDERALLY SPONSORED RESEARCH OR DEVELOPMENT

This invention was made with government support under Grant No, DAAD19-02-D-0002 awarded by the Army Research Office. The government has certain rights in the invention.

TECHNICAL FIELD

The present invention relates to photovoltaic devices.

BACKGROUND

Semiconducting organic molecules, metal oxides, conjugated polymers, and other presently unconventional electronic materials are being developed for use in electronic devices. By taking advantage of the special optical properties of such materials, novel optoelectronic devices can be fabricated within the classes of photoconductors and chemical sensors.

Materials such as organic molecules typically possess lower mobilities than inorganic semiconductors, due to the weak interactions between neighboring molecules (van der Waals forces). Creating useful electronic devices using these low-mobility materials is further complicated by the inherent coupling between the optical and electrical properties of the materials. Typically, strong absorbers act as insulating materials, and weak absorbers are conductive. Separation of the optical and electrical functions of the device into separate layers (and thus incorporating heterojunctions) to take advantage of each material's strength can improve device performance.

Photovoltaic devices can produce electrical current in response to excitation of an active component of the device. Excitation can be stimulated by illuminating the device with an appropriate wavelength of light. One class of photovoltaic devices, thin film photovoltaics, employs thin amorphous semiconducting layers to absorb light and generate charge carriers. Often, two types of semiconductors with dissimilar energy level structures are paired together to form a heterojunction where charge can be separated.

SUMMARY

In general, a heterojunction photovoltaic device includes two different semiconductors in electrical contact with one another. The electrical contact between the different semiconductors is referred to as a heterojunction, and is the site of charge separation. The heterojunction can also be the site of charge recombination, a process that lowers the quantum efficiency of the device.

Devices can use organic or inorganic materials for the hole transporting or electron transporting layers (or both) and can have high efficiency light-to-electricity conversion. In some cases, a device can include an additional light absorbing material, such as, for example, semiconductor nanocrystals, organic dyes, as well as organic or inorganic semiconductors for electrical transport. The inorganic semiconductors can be deposited by a low temperature method, such as sputtering, vacuum vapor deposition, ink jet printing, or ion plating.

A photoconductor can include two, three or more different materials arranged in a layered stack with electrodes arranged laterally with respect to the stack. The interfaces between these layers serve to separate photo-generated excitons into electrons and holes. These charge carriers are then swept to the electrodes in the presence of an applied electric field and detected as electrical current.

The device can provide photoconductive gain with a large photoresponse. Selection of layer materials can affect optical and electronic properties of the device. The absorption spectra of the constituent layers can control the range of wavelengths to which the device is sensitive, and their carrier mobilities govern how easily charge can be extracted from the device. Examples of suitable layer materials include, but are not limited to, organic molecules, metal oxides, semiconductor nanocrystals, and conjugated polymers.

In addition to serving as a photoconductor, the device can act as a chemical sensor if the top layer material is chosen or engineered to be chemically sensitive to a particular analyte.

In one aspect, a photovoltaic device includes a first electrode arranged on a substrate, a second electrode arranged on the substrate a distance apart from the first electrode, a first layer in contact with the first and second electrodes, the first layer including a charge transporting material, and a second layer in contact with the first layer, the second layer including an exciton generating material.

The device can include an interstitial layer intermediate the first layer and the second layer. The interstitial layer can include a cascade material. The interstitial layer can have a valence band energy level intermediate the valence band energy level of the charge transporting material and the valence band energy level of the exciton generating material. The interstitial layer can have a conduction band energy level intermediate the conduction band energy level of the charge transporting material and the conduction band energy level of the exciton generating material. The interstitial layer can have a thickness of less than 25 nm, less than 10 nm, or less than 5 nm.

The exciton generating material can include a semiconductor nanocrystal. The exciton generating material can include a chemosensitive material.

In another aspect, a method of making a device includes forming a first electrode on a substrate, forming a second electrode arranged on the substrate a distance apart from the first electrode, depositing a first layer in contact with the first and second electrodes, the first layer including a charge transporting material, and depositing a second layer in contact with the first layer, the second layer including an exciton generating material.

The method can include depositing an interstitial layer intermediate the first layer and the second layer. The interstitial layer can include a cascade material. The interstitial layer can have a valence band energy level intermediate the valence band energy level of the charge transporting material and the valence band energy level of the exciton generating material. The interstitial layer can have a conduction band energy level intermediate the conduction band energy level of the charge transporting material and the conduction band energy level of the exciton generating material. The interstitial layer can have a thickness of less than 25 nm, less than 10 nm, or less than 5 nm.

The exciton generating material can include a semiconductor nanocrystal. The exciton generating material can include a chemosensitive material.

In another aspect, a method of detecting light includes exposing a device to a source of light, where the device includes a first electrode arranged on a substrate, a second electrode arranged on the substrate a distance apart from the first electrode, a first layer in contact with the first and second electrodes, the first layer including a charge transporting material, and a second layer in contact with the first layer, the second layer including an exciton generating material, and detecting an electrical response across the first and second electrode.

The method can include depositing an interstitial layer intermediate the first layer and the second layer. The interstitial layer can include a cascade material. The interstitial layer can have a valence band energy level intermediate the valence band energy level of the charge transporting material and the valence band energy level of the exciton generating material. The interstitial layer can have a conduction band energy level intermediate the conduction band energy level of the charge transporting material and the conduction band energy level of the exciton generating material. The interstitial layer can have a thickness of less than 25 nm, less than 10 nm, or less than 5 nm.

The exciton generating material can include a semiconductor nanocrystal. The exciton generating material can include a chemosensitive material.

In a further aspect, a photovoltaic device includes a first plurality of electrodes arranged on a substrate, a second plurality of electrodes arranged on the substrate, where each electrode of the second plurality is spaced a distance apart from an first electrode of the first plurality, a first layer in contact with the first and second pluralities of electrodes, the first layer including a charge transporting material, and a second layer in contact with the first layer, the second layer including an exciton generating material.

The plurality of first electrodes can be arranged as a series of substantially parallel stripes on the substrate. The plurality of second electrodes can be arranged as a series of substantially parallel stripes on the substrate, interdigitated with the first plurality of electrodes.

Other features, objects, and advantages of the invention will be apparent from the description and drawings, and from the claims.

DETAILED DESCRIPTION

Figure 1:
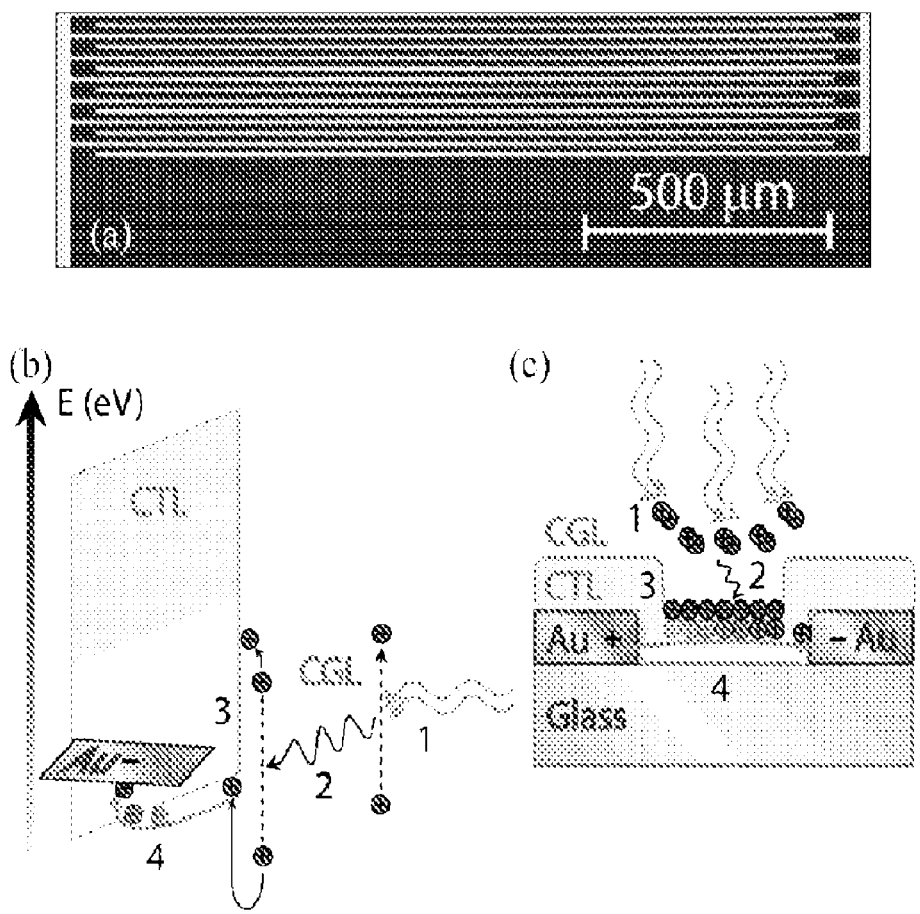
FIG. 1A is a photomicrograph of electrodes on a substrate.
FIGS. 1B-1C are schematic depictions of a photovoltaic device.

A photovoltaic device can include two layers separating two electrodes of the device. The material of one layer can be chosen based on the material's ability to transport holes, or the hole transporting layer (HTL). The material of the other layer can be chosen based on the material's ability to transport electrons, or the electron transporting layer (ETL). The electron transporting layer typically can include an absorptive layer. When a voltage is applied and the device is illuminated, one electrode accepts holes (positive charge carriers) from the hole transporting layer, while the other electrode accepts electrons from the electron transporting layer; the holes and electrons originate as excitons in the absorptive material. The device can include an absorptive layer between the HTL and the ETL. The absorptive layer can include a material selected for its absorption properties, such as absorption wavelength or linewidth. For photovoltaics consisting of low carrier concentration materials (such as organic small molecules, conjugated polymers, metal oxides and semiconductor nanocrystals) can exhibit a negligible depletion region resulting in a small internal potential across the device. In order to produce photocurrent, excited charge must separate at an interface and diffuse out to the appropriate electrode with minimal assistance from an external electric field.

In most organic photovoltaics a heterojunction interface is responsible for separating excitons. See, e.g., U.S. Pat. No. 5,821,019, which is incorporated by reference in its entirety. One layer at the interface possesses a low ionization potential and is known as the "donor" layer. The other layer has a high electron affinity and is known as the "acceptor" layer. The interface as a whole is referred to as a "donor-acceptor heterojunction," or "DA heterojunction," or in some cases simply as a heterojunction.

The process by which light is converted into electricity in organic photovoltaics can occur in four steps (illustrated FIG. 1):

1. First, a photon is absorbed by a material within the device and generates an exciton, or bound electron-hole pair.
2. That exciton diffuses to a donor-acceptor heterojunction in the device.
3. The exciton dissociates at the interface into an electron in the acceptor material and a hole in the donor material.
4. Finally, those dissociated charges are extracted from the device (via the electrodes) to contribute to an electrical current.

Efficiency of device operation can be measured by determining the external and internal quantum efficiencies. The external quantum efficiency (EQE) is a measure of how many charge carriers are extracted from the device for every incident photon. The internal quantum efficiency (IQE) is a measure of how many charge carriers are extracted from the device for every absorbed photon.

A lateral heterojunction photoconductor can include two or more layers, forming one or more donor-acceptor heterojunctions where adjacent layers meet. The device can include an exciton generation layer (EGL), selected for its optical properties and that is primarily responsible for generating absorbing incident light and generating excitons, and a charge transport layer (CTL) selected for its electronic properties and transports charge to the electrodes. The electrodes can be arranged in a lateral orientation and in contact with the CTL. The CTL can be positioned such that it is intermediate both electrodes and the EGL.

The device can exhibit photoconductive gain, which occurs when the transit time of the charge carriers is shorter than the recombination lifetime. Photoconductive gain can be detected as an IQE greater than unity. Gain and device bandwidth can be influenced by the spacing of the electrodes as well as the thickness of the layers. Greater amplification of the electrical signal increases the ease with which small signals can be observed, but reduces device speed.

Referring to FIG. 1A, gold electrodes are arranged on a substrate. The electrodes may be photolithographically defined as a series of interdigitated fingers. The lateral distance between electrodes of opposite polarity can be on the order of 1 μm to 500 μm, for example, from 1 μm to 200 μm, from 1 μm to 100 μm, from 1 μm to 50 μm, or from 1 μm to 25 μm. As pictured in FIG. 1A (a digital image of a set of device electrodes under 50× magnification), the spaces, or channels between the interdigitated "fingers" are each 1500 μm long by 10 μm wide. In a device with 100 such channels, the effective surface area is approximately 1.5 mm$^2$.

FIGS. 1B and 1C are diagrams illustrating the physical processes involved in a bi-layer device operation from two different perspectives. The two layers (an EGL, labeled in FIG. 1 as a charge generation layer (CGL) and a charge transport layer (CTL)) can be selected to optimize the photo-response of the device for a given application; for example, the materials are chosen such that the energy band alignment is favorable for exciton dissociation at the interface between the materials. FIG. 1B illustrates an energy band diagram for a device, and FIG. 1C shows a cross-sectional view of the same device. Both illustrations depict the physical processes involved in steady-state device operation: (1) absorption, (2) exciton diffusion, (3) exciton dissociation and charge transfer, and (4) charge transport.

The close proximity of opposite charges built up at the heterojunction can lead to a high probability of interfacial recombination because recombination increases with the number of available states and the degree of orbital overlap between states. Once a charge pair recombines at the interface, the capability of generating current from this pair is lost and the efficiency of the device decreases.

Additional layers can be added to a bi-layer device to create additional DA heterojunctions. A lateral tri-layer heterojunction photoconductor, for example, can have three layers: a primary charge generation layer (EGL), a charge transport layer (CTL), and an intermediate or interstitial layer between the EGL and CTL can act as a charge spacing layer (CSL). The interfaces separating the different layers can each act as donor-acceptor heterojunctions.

The interstitial layer, or cascade layer, can be included between the charge generation layer (EGL) and the charge transport layer (CTL). One or more interstitial layer(s) can be included at one or more heterojunctions of a photovoltaic device. An interstitial layer can substantially physically separate the locations where opposite charge carriers tend to accumulate. The idea is analogous to the method of charge separation used in photosynthesis, where an electron transport chain funnels electrons between reaction centers using a series of molecules with progressively lower energy levels. In the case of a solid state photovoltaic, the interstitial layer(s) funnel(s) charge between two sensitizer layers or between a sensitizer layer and a transport layer.

The interstitial layer can be sufficiently transparent (e.g., substantially transparent, greater than 99% transparent, or no less than 66% transparent) such that additional charge carriers generated within the film do not significantly raise carrier concentration levels. The interstitial layer can have a thickness such that charge transport or tunneling across the film is efficient enough to maintain a low carrier concentration at the film boundaries. The interstitial layer can have a thickness of, for example, less than 25 nm, less than 10 nm, or less than 5 nm. The interstitial layer can have a thickness approximately equal to a layer of the cascade material one molecule thick (e.g., the interstitial layer is a monolayer of the cascade material). The energy levels of the material or materials in the interstitial layer are selected such that charge can easily traverse the film in the direction of photocurrent flow and cannot easily traverse the film in the direction opposing photocurrent flow under operating conditions. For example, the energy levels of the interstitial layer can be intermediate the energy levels of the adjacent layers.

The interstitial layer can be applied to a layer having a substantially smooth surface, e.g., a surface having an rms roughness of less than 20 nm, less than 15 nm, less than 10 nm, or less than 5 nm. The performance of the device can be enhanced if the interstitial layer has a surface match with at least one adjacent layer. A surface match can promote a substantially smooth surface on the interstitial layer. A surface match can arise when the cascade material and the material of the adjacent layer have chemical similarity, such as similarity in molecular size and functional groups. For example, compounds bearing aryl groups can have a surface match with other compounds bearing aryl groups. Similarly for compounds bearing, e.g., alkyl or fluorinated alkyl groups. Similarly, oxide films can have a surface match with compounds bearing carboxylic, thiol, or alkyl groups.

The valence band and conduction band energy levels of the interstitial layer can be intermediate the energy levels of the valence band and conduction band levels, respectively, of the HTL and the ETL. The entire stack is sandwiched between conducting electrodes. The interstitial layer (or cascade layer) can preferably have a low absorption coefficient and be substantially incapable of generating carriers, particularly under operating conditions. Instead, it can transport excited electrons from the HTL to the ETL and excited holes from the ETL to the HTL. Therefore, charge is unable to build up in the cascade layer for two reasons: (1) carriers are continuously extracted from the opposite side from which they were injected, and (2) the thickness of the layer is sufficiently small to prevent the linear concentration gradient from reaching a high value at the interface. An interstitial layer can be used at any interface between two layers (e.g., layers of two different materials) in a device. For example, an interstitial layer can be used at an interface between any one of an absorbing layer, a transport layer, an electrode, and a combination thereof. In some embodiments, multiple cascade layers can be chained together to increase the charge separating effect.

The interstitial layer can include materials such as, for example, organic molecules, conjugated polymers, semiconducting metal oxides, semiconductor nanocrystals (e.g., colloidal inorganic semiconductor nanocrystals), or an amorphous or polycrystalline inorganic semiconductor. A person of ordinary skill in the art will be able to select appropriate materials according to desired energy levels and other material properties.

The substrate can be opaque or transparent. A transparent substrate can be used to in the manufacture of a transparent device. See, for example, Bulovic, V. et al., *Nature* 1996, 380, 29; and Gu, G. et al., *Appl. Phys. Lett.* 1996, 68, 2606-2608, each of which is incorporated by reference in its entirety. The substrate can be rigid or flexible. The substrate can be plastic, metal or glass. The first electrode can be, for example, a high work function hole-injecting conductor, such as an indium tin oxide (ITO) layer. Other first electrode materials can include gallium indium tin oxide, zinc indium tin oxide, titanium nitride, or polyaniline. The second electrode can be, for example, a low work function (e.g., less than 4.0 eV), electron-injecting, metal, such as Al, Ba, Yb, Ca, a lithium-aluminum alloy (Li:Al), or a magnesium-silver alloy (Mg:Ag), a high work function metal (e.g., Au, Ag, Pt) a graphite electrode, or a transparent conductor (e.g., ITO). The second electrode, such as Mg:Ag, can be covered with an opaque protective metal layer, for example, a layer of Ag for protecting the cathode layer from atmospheric oxidation, or a relatively thin layer of substantially transparent ITO. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms.

The employment of semiconductor nanocrystals as the EGL allows the device designer to precisely tune the absorption band edge of the detector across visible and even infrared wavelengths depending on material choice. For example, CdSe which possesses a bulk bandgap of 1.74 eV, can be tuned using the quantum size effect to absorb across the visible part of the spectrum while nanocrystals of PbS or PbSe, which have bandgaps of about 0.4 eV and 0.27 eV, respectively, can cover much of the short wave infrared (SWIR).

The selection of layer materials can also provide chemical sensing ability to the device. For example, a fluorescent conjugated polymer sensitive to some particular analyte can be used as the CGL.

State-of-the-art fluorescent polymer sensor schemes require an optical excitation source (LED) to excite a chemically sensitive, fluorescent polymer film, a photodetector to measure changes in signal intensity, and a filter to prevent the optical excitation from being measured. The transduction of the chemical signal into an electrical signal occurs when the polymer film's luminescence changes in response to the presence of an analyte and having that change measured by the photodetector. See, e.g., U.S. Pat. No. 7,208,122, which is incorporated by reference in its entirety. In this method, optical coupling losses can be high, due to the polymer's lambertian emitter profile. Typically, only a small fraction of the polymers' luminescence makes it through to the photodetector. This has consequences for the signal-to-noise ratio because the detected fluorescence signal competes with noise in the system from both optical and electronic sources. Despite having sensitivities on the order of parts per trillion in a fraction of a second, there are still compounds whose vapor pressures are beyond the detection limits of this sensing architecture, one example being the explosive RDX. Reducing coupling efficiency losses can improve signal-to-noise ratio and ultimately sensitivity. Additionally, the requirement of having a photodetector and a filter for detection add to the cost and the mechanical complexity of the sensor.

Figure 8:
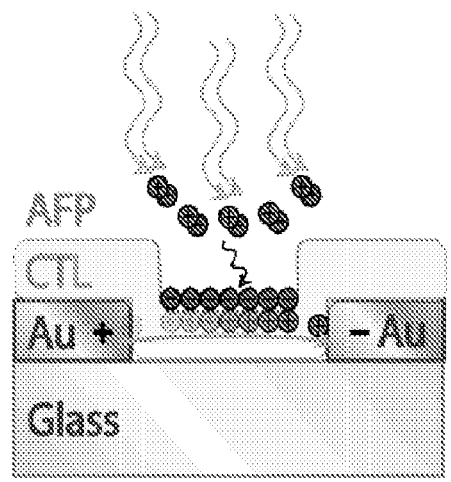
FIGS. 8A-8B are schematic depictions of a photovoltaic device.
Figure 8:
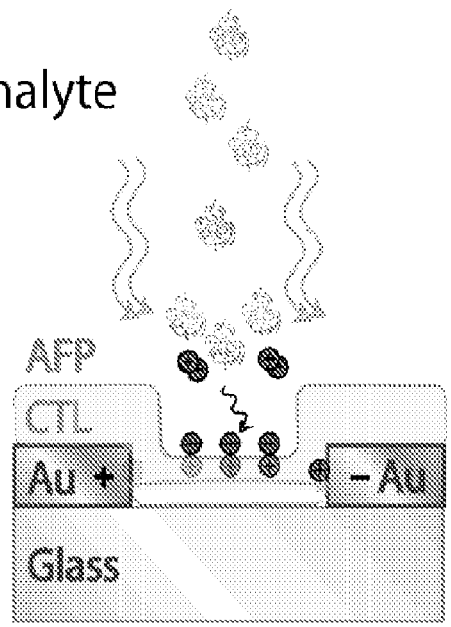

The chemical sensing functionality can be incorporated in a photovoltaic device by separating the charge transporting material from the chemically sensitive material. For example, an amplified fluorescent polymer (AFP) can be deposited on top of a CTL to create a chemosensing bi-layer heterojunction. The CTL could be a metal oxide layer, while the EGL could be an amplified fluorescent polymer which is sensitive to a specific analyte. If analyte binds to the surface of the polymer, a number of exciton quenching centers develop along the polymer backbone. Upon light excitation, the reduced exciton density in the EGL will manifest as a reduction in the population of charge carriers at the heterojunction. The reduction of charge carriers would then result in a smaller measured photocurrent, demonstrating chemosensitivity (FIG. 8).

The same principles are relevant for multi-layer chemosensing photoconductors. A number of potential benefits arise from developing a chemosensing multi-layer heterojunction. First, by physically separating the sensing and transport functions in chemical sensors, optimization of the sensor's electrical properties can occur without affecting chemical specificity. Band energy differences, trapping distributions, interface properties, and bias voltages are just a few of the possible parameters that can be used to engineer better vapor-phase chemosensors. Another benefit is the development of a reusable device platform for a variety of chemosensing applications. Because the polymer's chemical specificity is no longer coupled to its conductivity, many existing chemosensing fluorescent polymers can be matched with appropriate CTLs to yield vapor-phase sensors, so long as the polymers retain their photoluminescent efficiency in the solid state. Relaxing the constraint that the polymer must be conductive also simplifies the synthesis of new, chemically specific polymers for this sensing platform. Finally, the electrical amplification inherent in many photoconductive structures enables the use of much thinner active layers while maintaining a measurable signal. Thinning the chemosensing polymer layer will allow the analyte to diffuse throughout the entire film, reducing the background luminescence that is generated from unquenched polymer bulk.

The organic semiconductor material can be selected from among common compounds, such as phthalocyanine, phthalocyanine/bisnaphthohalocyanine, polyphenol, polyanthracene, polysilane, polypyrrole, 4,4'-bis[N-(1-naphtyl)-N-phenyl-amino]biphenyl (NPB), and N,N'-diphenyl-N,N'-bis(3-methylphenyl)-(1,1'-biphenyl)-4,4'-diamine (TPD), B-NPB (N,N'-Bis(naphthalen-2-yl)-N,N'-bis(phenyl)-benzidine), spiro-TPD (N,N'-Bis(3-methylphenyl)-N,N'-bis-(phenyl)-9,9-spiro-bifluorene), spiro-NPB (N,N'-Bis(naphthalen-1-yl)-N,N'-bis(phenyl)-9,9-spiro-bifluorene), DMFL-TPD (N,N'-Bis(3-methylphenyl)-N,N'-bis(phenyl)-9,9-dimethyl-fluorene), DMFL-NPD (N,N'-Bis(naphthalen-1-yl)-N,N'-bis (phenyl)-9,9-dimethyl-fluorene), DPFL-TPD (N,N'-Bis-(3-methylphenyl)-N,N'-bis(phenyl)-9,9-diphenyl-fluorene), DPFL-NPB (N,N'-Bis(naphthalen-1-yl)-N,N'-bis(phenyl)-9,9-diphenyl-fluorene), spiro-TAD (2,2',7,7'-Tetrakis(m,n-diphenylamino)-9,9'-spirobifluorene), BPAPF (9,9-Bis[4-(N,N-bis-biphenyl-4-yl-amino)phenyl]-9H-fluorene), NPAPF (9,9-Bis[4-(N,N-bis-naphthalen-2-yl-amino)phenyl]-9H-fluorene), NPBAPF (9,9-Bis[4-(N,N'-bis-naphthalen-2-yl-N,N'-bis-phenyl-amino)-phenyl]-9H-fluorene), spiro-2NPB (2,2',7,7'-Tetrakis[N-naphthalenyl(phenyl)-amino]-9,9-spiro-bifluorene), PAPB (N,N'-bis(phenanthren-9-yl)-N,N'-bis(phenyl)-benzidine), spiro-5 (2,7-Bis[N,N-bis(9,9-spiro-bifluorene-2-yl)-amino]-9,9-spiro-bifluorene), spiro-DBP (2,2'-Bis[N,N-bis(biphenyl-4-yl)amino]9,9-spiro-bifluorene), spiro-BPA (2,2'-Bis(N,N-di-phenyl-amino)9,9-spiro-bifluorene), CuPc (Phthalocyanine, Copper complex), m-MTDATA (4,4',4"-Tris(N-3-methylphenyl-N-phenyl-amino)triphenylamine), 2T-NATA (4,4',4"-Tris(N-(2-naphthyl)-N-phenyl-amino)triphenylamine), 1T-NATA (4,4',4"-Tris(N-(1-naphthyl)-N-phenyl-amino)triphenylamine), NATA (4,4',4"-Tris(N,N-diphenyl-amino)triphenylamine), PPDN (Pyrazino[2,3-f][1,10]phenanthroline-2,3-dicarbonitrile), Meo-TPD (N,N,N',N'-tetrakis(4-methoxyphenyl)benzidine), Meo-spiro-TPD (2,7-Bis[N,N-bis(4- methoxy-phenyl)amino]9,9-spiro-bifluorene), F4-TCNQ, NTCDA, TCNQ, PTCDA, BCP, CBP, F16-CuPc, PTCBI, NPD, or pentacene.

A hole transporting layer (HTL) or an electron transporting layer (ETL) can include an inorganic material, such as an inorganic semiconductor. The inorganic semiconductor can be any material with a band gap greater than the emission energy of the emissive material. The inorganic semiconductor can include a metal chalcogenide, metal pnictide, or elemental semiconductor, such as a metal oxide, a metal sulfide, a metal selenide, a metal telluride, a metal nitride, a metal phosphide, a metal arsenide, or metal arsenide. For example, the inorganic material can include zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, a zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, or a mixture thereof. The metal oxide can be a mixed metal oxide, such as, for example, ITO. In a device, a layer of pure metal oxide (i.e., a metal oxide with a single substantially pure metal) can develop crystalline regions over time degrading the performance of the device. A mixed metal oxide can be less prone to forming such crystalline regions, providing longer device lifetimes than available with pure metal oxides. The metal oxide can be a doped metal oxide, where the doping is, for example, an oxygen deficiency, a halogen dopant, or a mixed metal. The inorganic semiconductor can include a dopant. In general, the dopant can be a p-type or an n-type dopant. An HTL can include a p-type dopant, whereas an ETL can include an n-type dopant.

Single crystalline inorganic semiconductors have been proposed for charge transport to semiconductor nanocrystals in devices. Single crystalline inorganic semiconductors are deposited by techniques that require heating the substrate to be coated to a high temperature. However, the top layer semiconductors must be deposited directly onto the nanocrystal layer, which is not robust to high temperature processes, nor suitable for facile epitaxial growth. Epitaxial techniques (such as chemical vapor deposition) can also be costly to manufacture, and generally cannot be used to cover a large area, (i.e., larger than a 12 inch diameter wafer).

Advantageously, the inorganic semiconductor can be deposited on a substrate at a low temperature, for example, by sputtering. Sputtering is performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

The substrate or a the device being manufactured is cooled or heated for temperature control during the growth process. The temperature affects the crystallinity of the deposited material as well as how it interacts with the surface it is being deposited upon. The deposited material can be polycrystalline or amorphous. The deposited material can have crystalline domains with a size in the range of 10 Angstroms to 1 micrometer. Doping concentration can be controlled by varying the gas, or mixture of gases, which is used for the sputtering plasma. The nature and extent of doping can influence the conductivity of the deposited film, as well as its ability to optically quench neighboring excitons. By growing one material on top of another, p-n or p-i-n diodes can be created. The device can be optimized for delivery of charge to a semiconductor nanocrystal monolayer.

The layers can be deposited on a surface of one of the electrodes by spin coating, dip coating, vapor deposition, sputtering, or other thin film deposition methods. The second electrode can be sandwiched, sputtered, or evaporated onto the exposed surface of the solid layer. One or both of the electrodes can be patterned. The electrodes of the device can be connected to a voltage source by electrically conductive pathways. Upon application of the voltage, light is generated from the device.

Photovoltaic devices including semiconductor nanocrystals can be made by spin-casting a solution containing the HTL organic semiconductor molecules and the semiconductor nanocrystals, where the HTL formed underneath of the semiconductor nanocrystal monolayer via phase separation (see, for example, U.S. patent application Ser. Nos. 10/400, 907, filed Mar. 28, 2003, and U.S. Patent Application Publication No. 2004/0023010, each of which is incorporated by reference in its entirety). This phase separation technique reproducibly placed a monolayer of semiconductor nanocrystals between an organic semiconductor HTL and ETL, thereby effectively exploiting the favorable light absorption properties of semiconductor nanocrystals, while minimizing their impact on electrical performance. Devices made by this technique were limited by impurities in the solvent, by the necessity to use organic semiconductor molecules that are soluble in the same solvents as the semiconductor nanocrystals. The phase separation technique was unsuitable for depositing a monolayer of semiconductor nanocrystals on top of both a HTL and a HIL (due to the solvent destroying the underlying organic thin film). Nor did the phase separation method allow control of the location of semiconductor nanocrystals that emit different colors on the same substrate; nor patterning of the different color emitting nanocrystals on that same substrate.

Microcontact printing provides a method for applying a material to a predefined region on a substrate. The predefined region is a region on the substrate where the material is selectively applied. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

In general, microcontact printing begins by forming a patterned mold. The mold has a surface with a pattern of elevations and depressions. A stamp is formed with a complementary pattern of elevations and depressions, for example by coating the patterned surface of the mold with a liquid polymer precursor that is cured while in contact with the patterned mold surface. The stamp can then be inked; that is, the stamp is contacted with a material which is to be deposited on a substrate. The material becomes reversibly adhered to the stamp. The inked stamp is then contacted with the substrate. The elevated regions of the stamp can contact the substrate while the depressed regions of the stamp can be separated from the substrate. Where the inked stamp contacts the substrate, the ink material (or at least a portion thereof) is transferred from the stamp to the substrate. In this way, the pattern of elevations and depressions is transferred from the stamp to the substrate as regions including the material and free of the material on the substrate. Microcontact printing and related techniques are described in, for example, U.S. Pat. Nos. 5,512,131; 6,180,239; and 6,518,168, each of which is incorporated by reference in its entirety. In some circumstances, the stamp can be a featureless stamp having a pattern of ink, where the pattern is formed when the ink is applied to the stamp. See U.S. patent application Ser. No. 11/253,612, filed Oct. 21, 2005, which is incorporated by reference in its entirety. Additionally, the ink can be treated (e.g., chemically or thermally) prior to transferring the ink from the stamp to the substrate. In this way, the patterned ink can be exposed to conditions that are incompatible with the substrate.

The basic steps in the microcontact printing include first making a silicon master using standard semiconductor processing techniques which define a pattern on the silicon surface, for example a pattern of elevations and depressions (alternatively, for a non-patterned deposition, a blank Si master can be used). Poly dimethyl siloxane (PDMS, for example Sylgard 184) precursors are then mixed, degassed, poured onto the master, and degassed again, and allowed to cure at room temperature (or above room temperature, for faster cure times) (step 1). The PDMS stamp, having a surface including the pattern of the silicon master, is then freed from the master, and cut into the desired shape and size. This stamp is then coated with a surface chemistry layer, selected to readily adhere and release the ink as needed. For example, the surface chemistry layer can be a chemical vapor deposited Parylene-C layer. The surface chemistry layer can be, for example, 0.1 to 2 µm thick, depending on the pattern to be reproduced (step 2). This stamp is then inked, for example by spin-casting, syringe pump dispensing, or ink jet printing a solution of semiconductor nanocrystals (step 3). The solution can have, for example, a concentration of 1-10 mg/mL in chloroform. The concentration can be varied depending on desired outcome. The inked stamp can then be contacted to a substrate, and gentle pressure applied for, for example, 30 seconds to transfer the ink (i.e., a semiconductor nanocrystal monolayer) completely to the new substrate (step 4). An ITO coated glass substrate is prepared as follows. A hole transport and/or a hole injection layer (HTL and HIL, respectively) including organic semiconductor is thermally evaporated onto the ITO substrate. The patterned semiconductor nanocrystal layer is transferred to this HTL layer, and the rest of the device (e.g., electron transport layer (ETL), electron injection layer (EIL), and electrodes, as desired) can then be added (step 5). See, for example, U.S. patent application Ser. Nos. 11/253,595, and 11/253,612, both filed Oct. 21, 2005, and 11/032,163, filed Jan. 11, 2005, each of which is incorporated by reference in its entirety.

When a nanocrystal absorbs a photon, an excited electron-hole pair results. The absorption wavelength is related to the effective band gap of the quantum confined semiconductor material. The band gap is a function of the size, shape, material, and configuration of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The semiconductor forming the nanocrystals can include a Group II-VI compound, a Group II-V compound, a Group III-VI compound, a Group III-V compound, a Group IV-VI compound, a Group compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide (($TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), bis(trimethylsilyl)sulfide (($TMS)_2S$), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

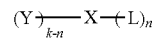

wherein k is 2, 3 or 5, and n is 1, 2, 3, 4 or 5 such that k−n is not less than zero; X is O, S, S=O, SO$_2$, Se, Se=O, N, N=O, P, P=O, As, or As=O; each of Y and L, independently, is aryl, heteroaryl, or a straight or branched C$_{2-12}$ hydrocarbon chain optionally containing at least one double bond, at least one triple bond, or at least one double bond and one triple bond. The hydrocarbon chain can be optionally substituted with one or more C$_{1-4}$ alkyl, C$_{2-4}$ alkenyl, C$_{2-4}$ alkynyl, C$_{1-4}$ alkoxy, hydroxyl, halo, amino, nitro, cyano, C$_{3-5}$ cycloalkyl, 3-5 membered heterocycloalkyl, aryl, heteroaryl, C$_{1-4}$ alkylcarbonyloxy, C$_{1-4}$ alkyloxycarbonyl, C$_{1-4}$ alkylcarbonyl, or formyl. The hydrocarbon chain can also be optionally interrupted by —O—, —S—, —N(R$^a$)—, —N(R$^a$)—C(O)—O—, —O—C(O)—N(R$^a$)—, —N(R$^a$)—C(O)—N(R$^b$)—, —O—C(O)—O—, —P(R$^a$)—, or —P(O)(R$^a$)—. Each of R$^a$ and R$^b$, independently, is hydrogen, alkyl, alkenyl, alkynyl, alkoxy, hydroxyalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

A suitable coordinating ligand can be purchased commercially or prepared by ordinary synthetic organic techniques, for example, as described in J. March, *Advanced Organic Chemistry*, which is incorporated by reference in its entirety.

Transmission electron microscopy (TEM) can provide information about the size, shape, and distribution of the nanocrystal population, Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Individual devices can be formed at multiple locations on a single substrate to form a photovoltaic array. In some applications, the substrate can include a backplane. The backplane includes active or passive electronics for controlling or switching power to or from individual array elements. Including a backplane can be useful for applications such as displays, sensors, or imagers. In particular, the backplane can be configured as an active matrix, passive matrix, fixed format, directly drive, or hybrid. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of device efficiency during the fabrication process. Other multilayer structures may be used to improve the device performance (see, for example, U.S. patent application Ser. Nos. 10/400,907 and 10/400,908, filed Mar. 28, 2003, each of which is incorporated by reference in its entirety). A blocking layer, such as an electron blocking layer (EBL), a hole blocking layer (HBL) or a hole and electron blocking layer (eBL), can be introduced in the structure. A blocking layer can include 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris {N-(3-methylphenyl)-N-phenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tert-butylphenyl)-1,3,4-oxadiazole, 1,3-bis[5-(4-(1,1-dimethylethyl)phenyl)-1,3,4-oxadiazol-2-yl]benzene, 1,4-bis(5-(4-diphenylamino)phenyl-1,3,4-oxadiazol-2-yl)benzene, or 1,3,5-tris[5-(4-(1,1-dimethylethyl)phenyl)-1,3,4-oxadiazol-2-yl]benzene.

The performance of photovoltaic devices can be improved by increasing their efficiency. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Nanocrystals can be included in efficient hybrid organic/inorganic light emitting devices.

Individual devices can be formed at multiple locations on a single substrate to form a display. The display can include devices that emit at different wavelengths. By patterning the substrate with arrays of different color-emitting semiconductor nanocrystals, a display including pixels of different colors can be formed.

To form a device, a p-type semiconductor can be deposited on a transparent electrode such as indium time oxide (ITO). The transparent electrode can be arranged on a transparent substrate. Then, a cascade material can be deposited over the p-type semiconductor material to form an interstitial layer. The cascade material is selected to have energy levels intermediate those of the adjacent materials. See, for example, Sista, S. et al., Appl. Phys. Lett. 91, 223508 (2007), which is incorporated by reference in its entirety. Subsequently, an n-type semiconductor is applied, for example by sputtering, CVD, or another method, on top of the interstitial layer. A metal or semiconductor electrode can be applied over this to complete the device. More complicated device structures are also possible. For example, a lightly doped layer can be included, or a charge blocking layer, or additional interstitial layers. The device can be thermally treated after application of all of the transport layers.

The device can be assembled by separately growing the two transport layers, and physically applying the electrical contacts using an elastomer such as polydimethylsiloxane (PDMS).

The inorganic transport layers used, in particular metal-oxide materials can act as barrier layers to prevent $O_2$ and $H_2O$ from entering absorptive layer of the device (the semiconductor nanocrystal layer). The protective nature of the inorganic layer can provide design alternatives to the packaging. For example, because the inorganic layer can be a barrier to water and/or oxygen, the device can be built without the need for additional components to block such contaminants from reaching the emissive material. Encapsulant coatings such as BARIX ((made by Vitex) are made using alternating layers of metal oxides and polymers. In such barriers, the metal oxides are the barriers to $O_2$ and $H_2O$, and the polymer layers randomize the occurrences of pin hole defects in the metal oxide layers. Thus, in using the metal oxides as transport layers, the device itself functions as a protective layer to the semiconductor nanocrystals.

EXAMPLES

A bi-layer device was prepared using 3,4,9,10-perylenetetracarboxylic bis-benzimidazole (PTCBI) as an EGL, which is a small-molecule organic dye used commonly in organic solar cells. For the CTL, the hole transporting organic molecule, N,N'-diphenyl-N,N'-bis(3-methylphenyl)-(1,1'-biphenyl)-4,4'-diamine (TPD), was be used. The absorption spectra of these molecules are shown in FIG. 2.

Figure 2:
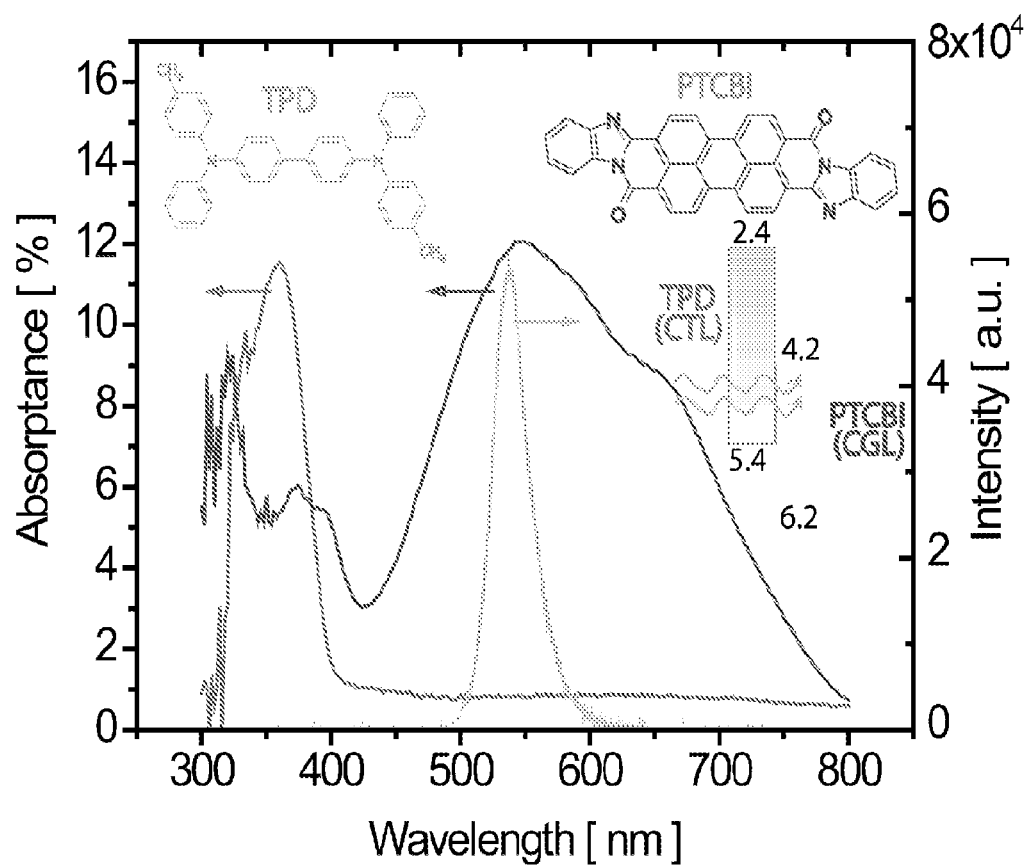
FIG. 2 is a graph illustrating optical properties of materials used in a photovoltaic device.

These materials were chosen for their non-overlapping spectra, which allowed for exclusive excitation of the PTCBI at wavelengths greater than 400 nm, and also for their energy structures, which resulted in a DA heterojunction suitable for dissociating excitons (see inset of FIG. 2). Both materials were thermally evaporated over gold electrodes (see FIG. 1A).

Figure 3:
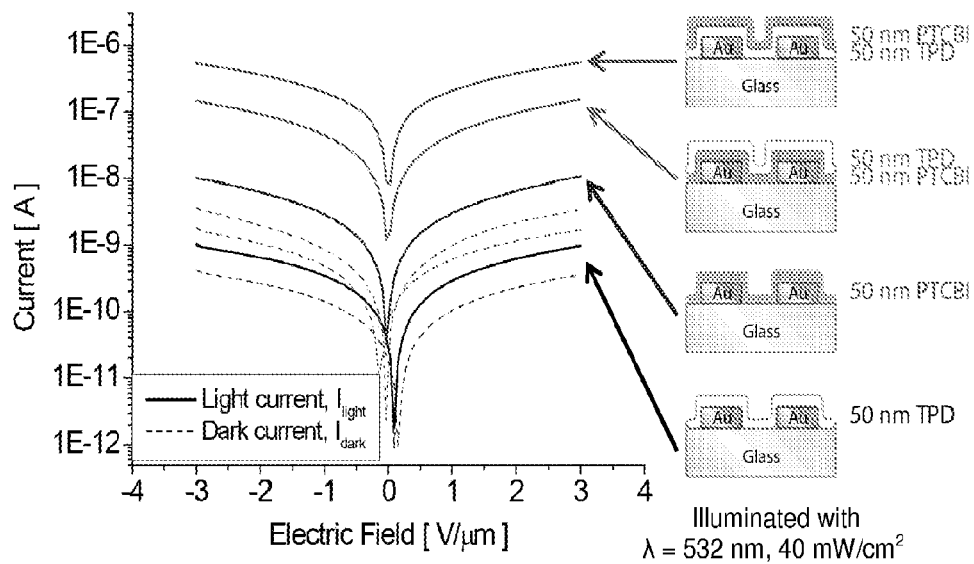
FIG. 3 is a graph depicting electrical properties of a photovoltaic device.

The current-voltage characteristics for a series of devices, in the dark and under illumination by a green LED, are shown in FIG. 3. All of the devices were either single films or bi-layer heterojunctions of PTCBI and TPD. The solid lines represent I-V sweeps in the light, while the dashed lines represent I-V sweeps in the dark.

The device with a single 50 nm film of TPD generated little to no photoresponse, which reflects the fact that TPD does not absorb green light; its absorption band cuts off around 400 nm. The single layer PTCBI device did generate a moderate photoresponse from the green light which can be seen by comparing the solid blue line to the dashed blue line. This indicated that despite there being no heterojunction present, excitons were still able to dissociate in the single film of PTCBI, to an extent. The bi-layer devices, however, exhibited a greatly enhanced photoresponse over that of the single layer PTCBI device (the red and green sets of lines).

Figure 4:
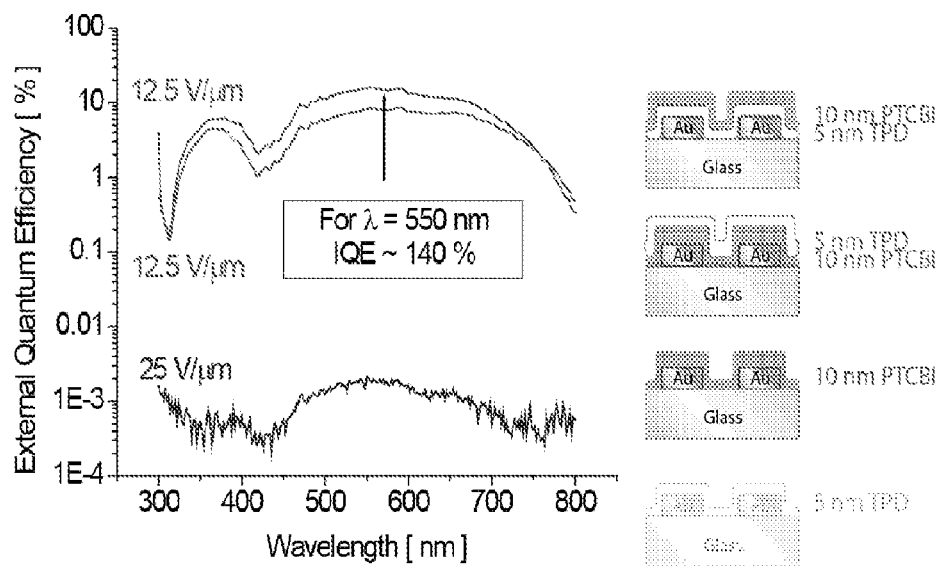
FIG. 4 is a graph depicting electrical properties of a photovoltaic device.

A plot of the external quantum efficiency for a TPD/PTCBI device is shown in FIG. 4. This measurement was obtained by optically chopping the illumination source and employing standard lock-in techniques to isolate the generated photocurrent. A TPD thin film by itself, while being more conductive than PTCBI, was not able to dissociate enough excitons to generate a measurable photocurrent. A single film of PTCBI was capable of breaking up excitons as was evident in the I-V sweep data. However, the introduction of the heterojunction interface in the bilayer devices vastly improved external quantum efficiency over that of single film devices; at 550 nm an EQE on the order of 10-12% was measured. Accounting for the number of photons absorbed in these films at this particular wavelength, the internal quantum efficiency was calculated to be approximately 140%. That the internal quantum efficiency is larger than 100% reflects the existence of gain in the device. For every absorbed photon, more than one charge carrier is being transported across the electrodes.

Another bi-layer device utilized a different material set: a layer of monodisperse semiconducting nanocrystals as the EGL, and another material with appropriate electronic properties as the CTL. The primary design consideration was that the EGL and CTL materials must be selected such that their energy bands create a DA heterojunction suitable for dissociating excitons.

Figure 5:
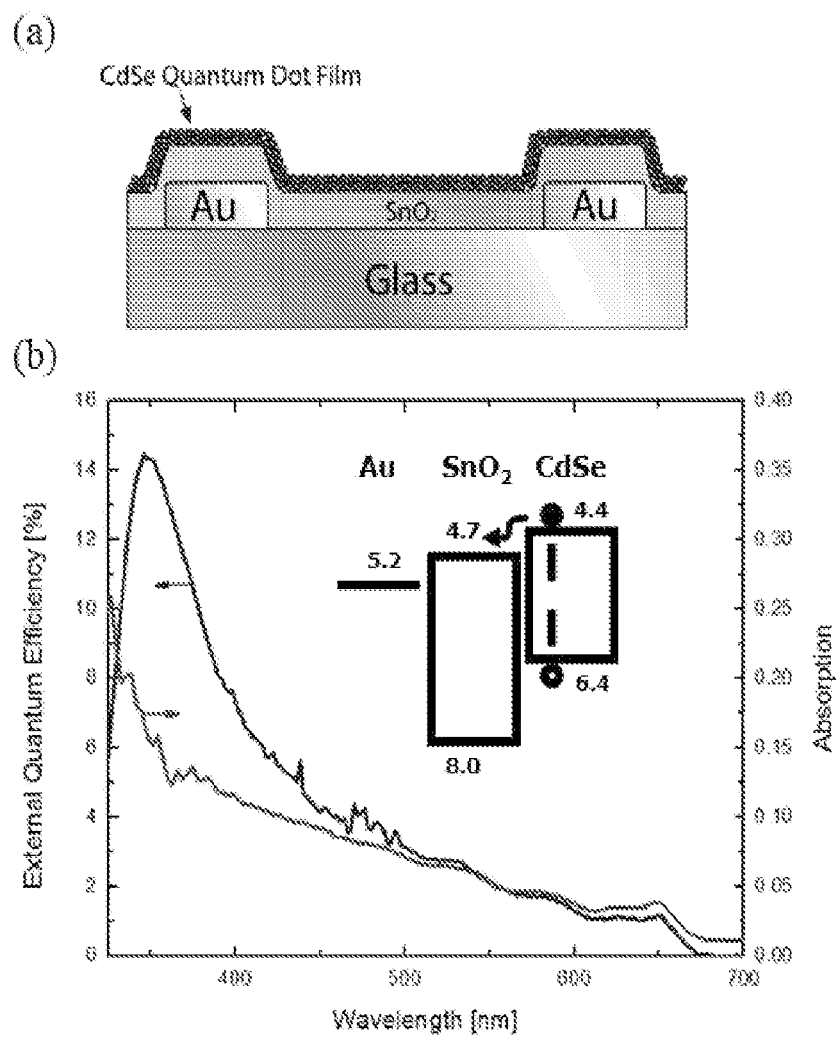
FIGS. 5A-5B are a schematic diagram of a photovoltaic device, and a graph depicting optical and electrical properties of the device, respectively.
Figure 6:
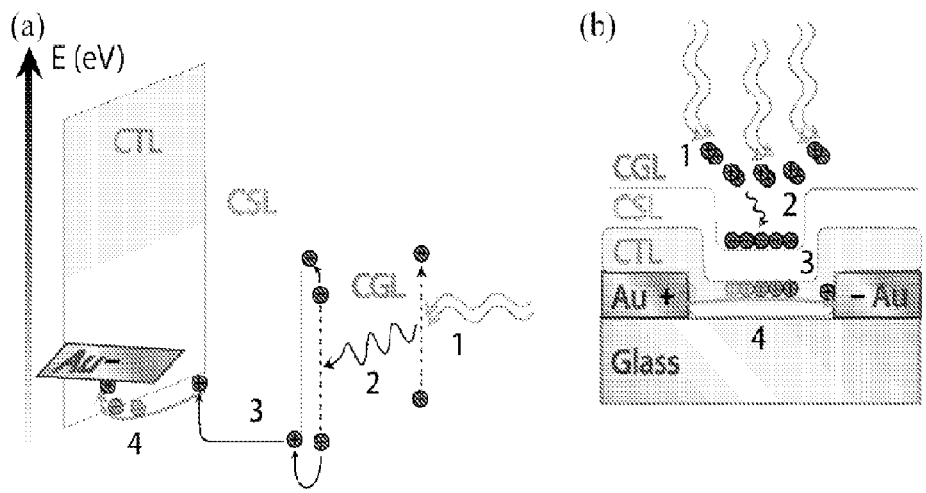
FIGS. 6A-6B are schematic depictions of a photovoltaic device.

An example of a lateral photoconductor incorporating semiconductor nanocrystals is shown in FIG. 5. In this device a layer of CdSe nanocrystals served as the EGL with a sputter-deposited layer of tin (II) oxide serving as the CTL. The quantum efficiency data shown in FIG. 5$b$ suggests that light was being absorbed in the CdSe nanocrystals, which absorb across the visible part of the spectrum with a peak at 650 nm, and that the generated excitons were effectively dissociated at the interface to contribute charge to the photoconductive process.

Figure 7:
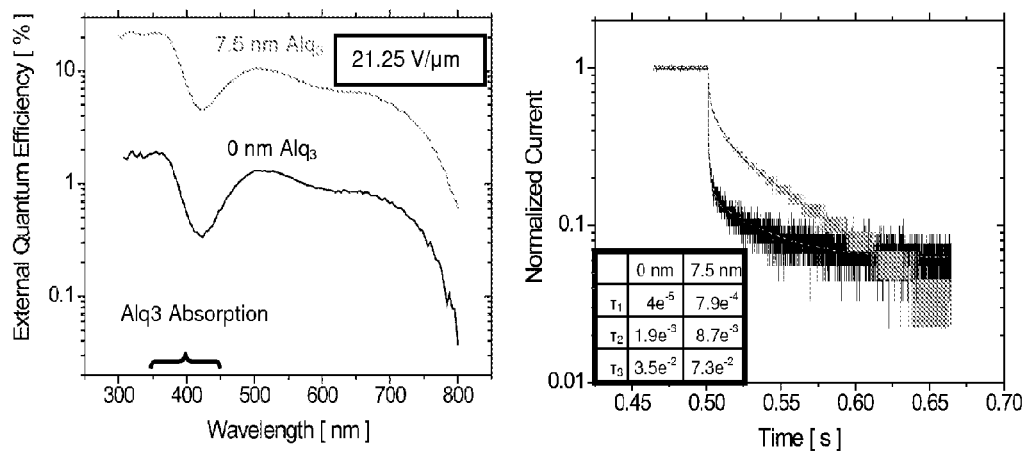
FIGS. 7A-7B are graphs depicting optical properties of a photovoltaic device.

Experiments employing $Alq_3$ as a CSL between TPD and PTCBI suggested that the separation of charge at the interface improved device performance. External quantum efficiency characteristics of the device showed an improvement of over an order of magnitude from a TPD/PTCBI photoconductor (see FIG. 7$a$). Time-response measurements also confirmed this result as the decay time of the electrical signal gets longer for the device with $Alq_3$ (see FIG. 7$b$). This can be explained by a decrease in the charge recombination rate across the heterointerface of TPD/PTCBI, due to the introduction of an interstitial $Alq_3$ layer.

Other embodiments are within the scope of the following claims.

What is claimed is:

1. A photovoltaic device comprising:
   a first electrode arranged on a substrate;
   a second electrode arranged on the substrate a distance apart from the first electrode;
   a first layer in contact with the first and second electrodes, the first layer including a charge transporting material;
   a second layer in contact with the first layer, the second layer including an exciton generating material; and
   an interstitial layer intermediate the first layer and the second layer, wherein the interstitial layer has a low absorption coefficient and is substantially incapable of generating carriers.

2. The device of claim 1, wherein the interstitial layer includes a cascade material.

3. The device of claim 1, wherein the interstitial layer has a valence band energy level intermediate the valence band energy level of the charge transporting material and the valence band energy level of the exciton generating material.

4. The device of claim 1, wherein the interstitial layer has a conduction band energy level intermediate the conduction band energy level of the charge transporting material and the conduction band energy level of the exciton generating material.

5. The device of claim 1, wherein the interstitial layer has a thickness of less than 25 nm.

6. The device of claim 1, wherein the interstitial layer has a thickness of less than 10 nm.

7. The device of claim 1, wherein the interstitial layer has a thickness of less than 5 nm.

8. The device of claim 1, wherein the exciton generating material includes a semiconductor nanocrystal.

9. The device of claim 1, wherein the exciton generating material includes a chemosensitive material.

10. A method of making a device, comprising:
    forming a first electrode on a substrate;
    forming a second electrode arranged on the substrate a distance apart from the first electrode;
    depositing a first layer in contact with the first and second electrodes, the first layer including a charge transporting material;
    depositing a second layer in contact with the first layer, the second layer including an exciton generating material; and
    depositing an interstitial layer intermediate the first layer and the second layer, wherein the interstitial layer has a low absorption coefficient and is substantially incapable of generating carriers.

11. A method of detecting light, comprising:
    exposing a device to a source of light, wherein the device includes
      a first electrode arranged on a substrate;
      a second electrode arranged on the substrate a distance apart from the first electrode;
      a first layer in contact with the first and second electrodes, the first layer including
      a charge transporting material;
      a second layer in contact with the first layer, the second layer including an exciton generating material; and
      an interstitial layer intermediate the first layer and the second layer, wherein the interstitial layer has a low absorption coefficient and is substantially incapable of generating carriers; and
    detecting an electrical response across the first and second electrode.

12. The method of claim 11, wherein the interstitial layer includes a cascade material.

13. The method of claim 11, wherein the interstitial layer has a valence band energy level intermediate the valence band energy level of the charge transporting material and the valence band energy level of the exciton generating material.

14. The method of claim 11, wherein the interstitial layer has a conduction band energy level intermediate the conduction band energy level of the charge transporting material and the conduction band energy level of the exciton generating material.

15. The method of claim 11, wherein the exciton generating material includes a semiconductor nanocrystal.

16. The method of claim 11, wherein the exciton generating material includes a chemosensitive material.

17. A photovoltaic device, comprising:
    a first plurality of electrodes arranged on a substrate;
    a second plurality of electrodes arranged on the substrate, wherein each electrode of the second plurality is spaced a distance apart from an first electrode of the first plurality;
    a first layer in contact with the first and second pluralities of electrodes, the first layer including a charge transporting material;
    a second layer in contact with the first layer, the second layer including an exciton generating material; and an interstitial layer intermediate the first layer and the second layer, wherein the interstitial layer has a low absorption coefficient and is substantially incapable of generating carriers.

18. The device of claim 17, wherein the plurality of first electrodes are arranged as a series of substantially parallel stripes on the substrate.

19. The device of claim 17, wherein the plurality of second electrodes are arranged as a series of substantially parallel stripes on the substrate, interdigitated with the first plurality of electrodes.

\* \* \* \* \*